United States Patent
Windischmann et al.

(10) Patent No.: US 6,274,837 B1
(45) Date of Patent: Aug. 14, 2001

(54) METHOD AND APPARATUS FOR IN-SITU SOLID STATE DOPING OF CVD DIAMONDS AND DIAMONDS SO MADE

(75) Inventors: Henry Windischmann, Northboro; John L. Yuscinsky, Webster, both of MA (US)

(73) Assignee: Saint-Gobain Industrial Ceramics, Inc., Worcester, MA (US)

( * ) Notice: Subject to any disclaimer, the term of this patent is extended or adjusted under 35 U.S.C. 154(b) by 0 days.

(21) Appl. No.: 09/334,305

(22) Filed: Jun. 16, 1999

(51) Int. Cl.⁷ .............................. B23H 9/00; B23K 10/02
(52) U.S. Cl. ..................... 219/69.17; 219/76.16; 427/449; 427/580; 423/275; 423/446
(58) Field of Search ........................ 427/449, 577, 427/580, 249.8; 423/446, 275; 219/121.15, 121.47, 69.17, 69.15, 69.11, 76.1, 76.16; 118/715

(56) References Cited

U.S. PATENT DOCUMENTS

| | | |
|---|---|---|
| 3,697,721 * 10/1972 | Robba et al. | |
| 3,904,505 * 9/1975 | Aisenberg. | |
| 4,228,142 * 10/1980 | Holcombe, Jr. et al. | |
| 5,112,775 5/1992 | Iida et al. | 437/225 |
| 5,260,106 11/1993 | Kawarada et al. | 427/577 |
| 5,591,484 * 1/1997 | Poncelet et al. | |
| 5,686,152 11/1997 | Johnson et al. | 427/577 |
| 5,698,328 * 12/1997 | Bunshah et al. | |
| 5,704,976 * 1/1998 | Snail. | |
| 5,858,471 * 1/1999 | Ray et al. | |
| 5,903,711 * 5/1999 | Okase. | |

OTHER PUBLICATIONS

Ken Okano et al, Synthesis of n–Type Semiconducting Diamond Film using Diphosphorus Pentaoxide as the Doping Source, Appl. Phys. A 51, 344–346 (1990).

X.K. Zhang et al, Boron Doping of Diamond Films by B2O3 Vaporization, phys. stat. sol. (a) 133, 377 (1992).

* cited by examiner

Primary Examiner—Tom Dunn
Assistant Examiner—Jonathan Johnson

(57) ABSTRACT

The method of the present invention includes placing a solid dopant in or near the nozzle of a DC arc jet. According to one embodiment of the invention, the interior surface of an arc jet nozzle is coated with a layer of copper by brushing the surface with a copper brush. According to another embodiment of the invention, the interior surface of an arc jet nozzle is coated with a layer of copper by plating it with copper. According to another embodiment of the invention, a copper cylinder is placed inside an arc jet nozzle. Apparatus according to the invention include a DC arc jet with a solid dopant placed in or near the nozzle according to one of the methods described. Diamonds according to the invention are conductive diamonds formed by a plasma jet process where a solid dopant was placed in or near the nozzle according to one of the methods described. According to the invention, the conductivity of the diamonds formed with these methods and apparatus is controlled by varying the surface area of the solid dopant. By increasing the surface area, the amount of dopant material contained in the diamond will be increased. High conductivity diamonds can be cut to size by electrical discharge milling or machining (EDM).

10 Claims, 2 Drawing Sheets

METHOD AND APPARATUS FOR IN-SITU SOLID STATE DOPING OF CVD DIAMONDS AND DIAMONDS SO MADE

BACKGROUND OF THE INVENTION

1. Field of the Invention

The invention relates to methods and apparatus for making doped diamonds and the doped diamonds made according to these methods. More particularly, the invention relates to methods and apparatus for doping a CVD diamond in order to increase the electrical conductivity of the diamond and to the diamonds produced according to these methods.

2. State of the Art

A diamond is an allotrope of carbon exhibiting a crystallographic network of exclusively covalently bonded, aliphatic sp3 hybridized carbon atoms arranged tetrahedrally with a uniform distance of 1.545 Angstroms between atoms. Due to this structure, diamonds are extremely hard and have a thermal conductivity approximately four times that of copper while being an electrical insulator. Although diamonds are most popularly known for their gemstone qualities, their hardness, thermal, and electrical properties make them very useful for many industrial applications.

Diamonds are used to true the surfaces of precision grinding wheels. In machine shops, tools tipped with diamonds cut grooves around automobile pistons and perform other precision-cutting tasks. Needles tipped with diamond dust are used to drill holes through other diamonds, which are then used as feeder nozzles for oil furnaces and as wire-drawing dies. Geologists and engineers use diamond-tipped hollow steel bits for drilling into the earth to secure samples of deep-lying rock formations. More recently, diamond films have been used in microelectronic applications as a heat sink or substrate for semiconductor devices.

Naturally occurring diamonds are believed to be the result of pure carbon having been subjected to tremendous pressure and heat deep within the earth. Synthetic, or man-made, diamonds became possible in 1955, when the General Electric Company used laboratory equipment to subject graphite to great pressure and heat. Today, diamonds can be grown as an equilibrium phase at high pressures or under metastable conditions at low pressures. One of the methods developed in recent years for producing diamonds is known as chemical vapor deposition (CVD). CVD methods use a mixture of hydrogen and a gaseous carbon compound such as methane which is activated and contacted with a substrate to produce a diamond film on the substrate. The hydrogen gas is disassociated into atomic hydrogen and then reacted with the carbon compound to form condensable carbon radicals including elemental carbon. The carbon radicals are then deposited on a substrate to form diamond. Some of the CVD methods use a hot filament, typically at temperatures of up to 2000° C., to provide the thermal activation temperatures necessary to bring about the conversions described above. These methods are referred to in the art as "hot filament chemical vapor deposition"(HFCVD). Another well known CVD method is the plasma jet system. In plasma jet systems, atomic hydrogen gas is typically introduced into a plasma torch which produces a hydrogen plasma jet by means of a direct current arc, an alternating current arc, or by microwave. The plasma torch is hot enough (typically approximately 10,000°K) to reduce gases to their elemental form. The torch is directed toward the substrate and the reagents exit a nozzle, or distribution head, and are deposited on the substrate.

It is generally known in the art that the physical properties of the manufactured diamond may be altered during the manufacturing process. For example, it is known in the literature that the introduction of a dopant (impurity) during the CVD process can affect the electrical characteristics of the resulting diamond. U.S. Pat. No. 5,112,775 discloses that an n-type semiconducting diamond film can be made by HFCVD using a solution of methyl alcohol, acetone, and diphosphorous pentoxide which is vaporized and used as the reactant gas with hydrogen to deposit a doped diamond film on an N-type silicon substrate. The resistivity of the phosphorous doped film was found to be approximately $10^2$ $\Omega$-cm regardless of the concentration of phosphorous in the reactant gas. The literature also discloses that a boron doped diamond film can be used to make a Schottky diode which has excellent rectifying characteristics. See Zhang, X. K. et al., "Boron Doping of Diamond Films by $B_2O_3$ Vaporization", Phys. Stat. Sol. (a) 133, 377 (1992). The resistivity of the boron doped diamond films was found to be approximately $10^0$ $\Omega$-cm to $10^{-2}$ $\Omega$-cm depending on the temperature of the boron at the time of the CVD process. All of the known doping methods require that a gas or an entrained powder be introduced into the reaction chamber with a flow rate controller. Various apparatus have been devised for this purpose. A typical plasma jet apparatus with a dopant feed pipe is disclosed in U.S. Pat. No. 5,260,106. The feed pipe is arranged to dispense dopant at a controlled rate to the tip of the anode.

Depending on the application, the manufactured diamond film may be deposited directly onto a substrate where it will remain, e.g. diamond may be directly deposited onto the tips of cutting tools. In other applications, a free-standing diamond film is removed from the substrate onto which it was deposited. In most of these applications it is necessary or desirable to cut, etch, or mill the free-standing diamond. State of the art operations of this type utilize a laser to cut, etch, or mill the diamond. The lasers used in these operations are relatively expensive.

Electrical discharge milling (or machining) (EDM) is an inexpensive process which has been used on many conductive materials but which has never been used successfully on a diamond film.

SUMMARY OF THE INVENTION

It is therefore an object of the invention to provide a method by which an EDM process may be used on a diamond film.

It is also an object of the invention to provide a simple method by which a diamond film may be doped during manufacture.

It is another object of the invention to provide a method by which a diamond film is provided with the correct amount of conductivity such that an EDM process may be used on the diamond film.

It is a further object of the invention to provide an efficient method of doping a diamond during manufacture which does not require that the dopant be dispensed as a gas or entrained powder.

Another object of the invention is to provide methods and apparatus for doping diamond which are easily used with existing plasma arc CVD apparatus.

A further object of the invention to provide a conductive diamond which is made with the methods and apparatus of the invention and which may be shaped using an EDM process.

In accord with these objects which will be discussed in detail below, the novel method of the present invention includes placing a solid dopant in or near the nozzle of a DC arc jet. According to one embodiment of the invention, the interior surface of an arc jet nozzle is coated with a layer of copper by brushing the surface with a copper brush. According to another embodiment of the invention, the interior surface of an arc jet nozzle is coated with a layer of copper by plating it with copper. According to another embodiment of the invention, a copper cylinder is placed inside an arc jet nozzle. Apparatus according to the invention include a DC arc jet with a solid dopant placed in or near the nozzle as described. The diamond products according to the invention are conductive diamonds formed by a plasma jet process where a solid dopant was placed in or near the nozzle as described. According to the invention, the conductivity of the diamonds formed with these methods and apparatus is controlled by varying the surface area of the solid dopant. By increasing the surface area, the amount of dopant material contained in the diamond will be increased.

Diamond doping according to the invention is more efficient than conventional doping methods and also permits the use of many different kinds of dopants since the dopant need not be a gas or fluid suspension.

Additional objects and advantages of the invention will become apparent to those skilled in the art upon reference to the detailed description taken in conjunction with the provided figures.

DETAILED DESCRIPTION OF THE PREFERRED EMBODIMENTS

Figure 1:
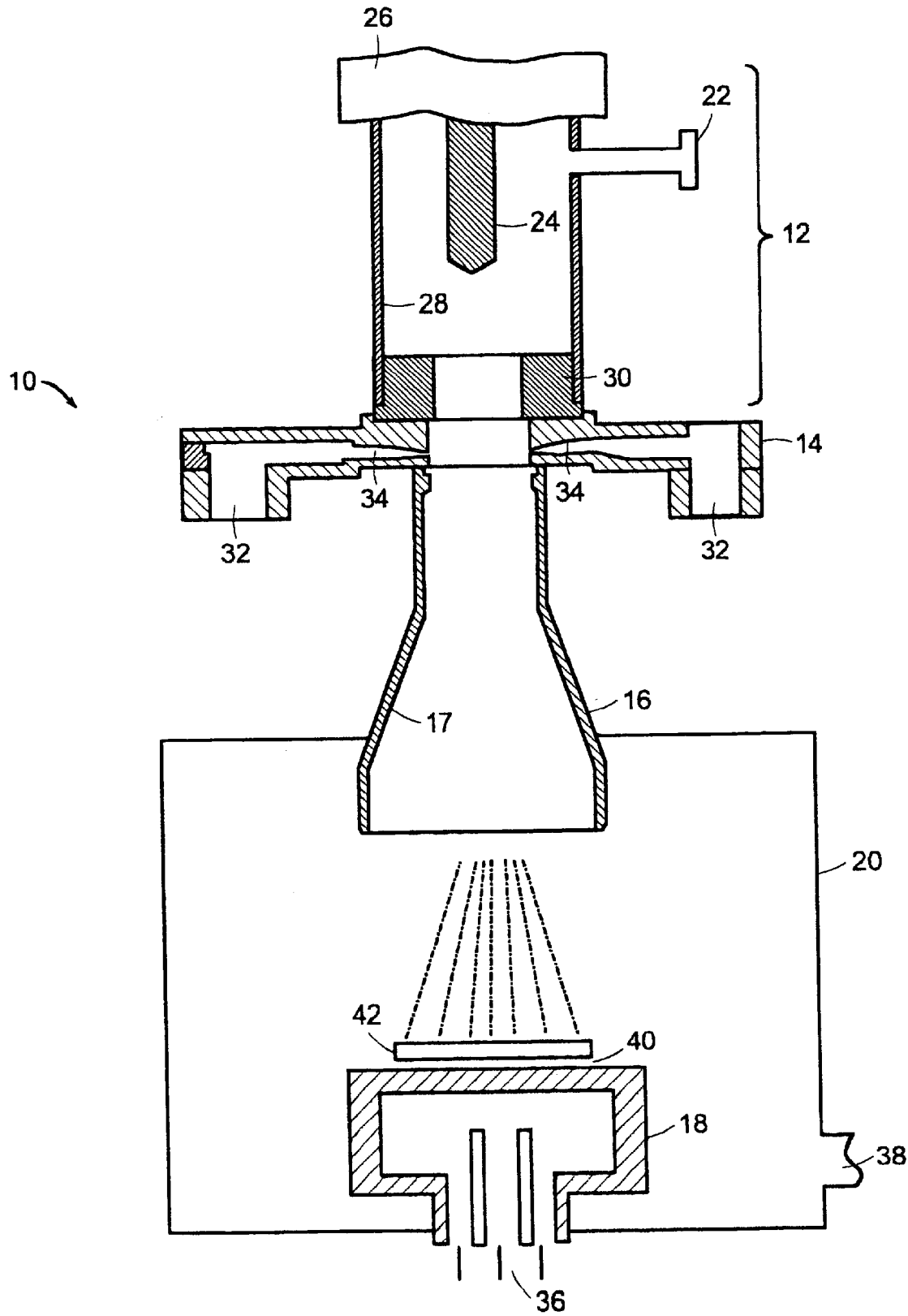
FIG. 1 is a broken schematic view in partial section of a first embodiment of an apparatus according to the invention.

Referring now to FIG. 1, a plasma jet CVD system 10 according to the invention generally includes an engine 12, a hydrocarbon gas injection disc 14, a plasma jet distribution head (nozzle) 16, a substrate holder 18, and a reaction chamber 20. The engine 12 is preferably an arc jet engine and includes a lateral hydrogen gas inlet 22, a cathode 24, an engine wall 26, an insulative lining 28 on the engine wall, and an anode 30. The hydrocarbon gas injection disc 14 is provided with gas feeds 32 and gas injection ports 34. The nozzle 16 is directed towards the substrate holder 18 inside the reaction chamber 20. The substrate holder 18 is preferably cooled by cooling water 36. The reaction chamber 20 is preferably provided with an exhaust 38 and is held at a low vacuum during the diamond deposition process.

According to the first embodiment of the invention, the interior surface 17 of the nozzle is coated with a solid dopant such as copper, iron, silicon, or boron. According to this embodiment, the coating may be accomplished in several different ways, such as by brushing the interior 17 of the nozzle 16 with a wire brush containing copper, or by electroplating, by PVDICVD, or by any other thin film process. With the surface 17 properly coated in a solid non-powder form, a substrate 40 is placed on the substrate holder 18, the reaction chamber 20 is evacuated, the cathode 24 and anode 30 are energized, hydrogen is fed through the inlet 22, methane is fed through the gas feeds 32, and the substrate holder 18 is cooled with water 36. The arc discharge between the cathode 24 and the anode 30 raises the temperature of the hydrogen to a plasma state whereupon it is mixed with methane, and decomposes the methane such that elemental hydrogen and elemental carbon flows through the nozzle 16 vaporizing the coating on the interior surface 17 of the nozzle. The elemental carbon and vaporized dopant ultimately strike the substrate 40 and form a diamond film 42. The diamond film 42 has a conductivity three to five orders of magnitude higher than a diamond film formed according to the same process but without the dopant coating the interior of the nozzle. This enhanced conductivity has been found to enable the diamond to be machined by an EDM process.

Figure 2:
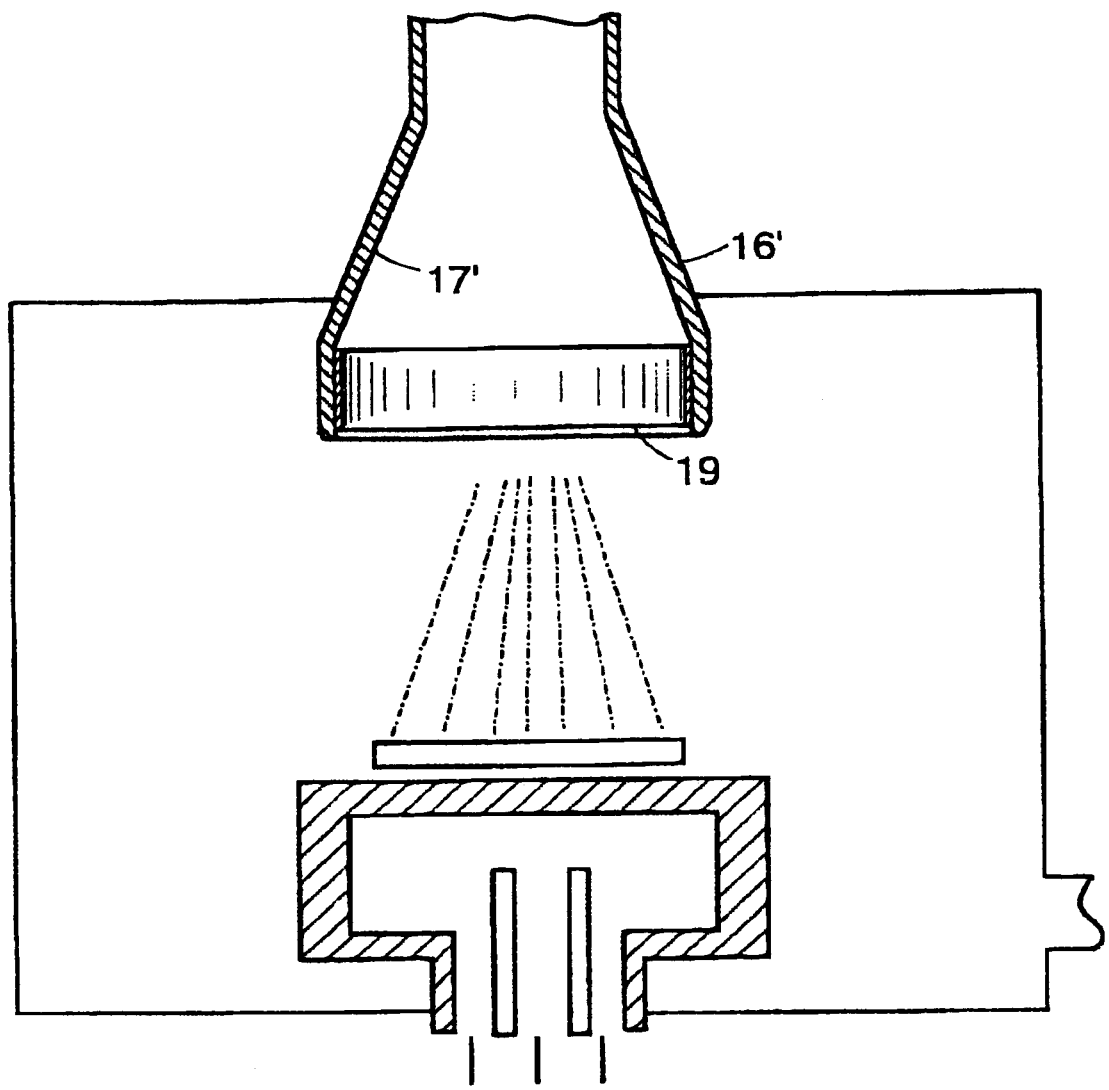
FIG. 2 is a broken schematic view in partial section of a second embodiment of an apparatus according to the invention.

Turning now to FIG. 2, and according to a second embodiment of the invention, a cylindrical copper liner 19 is placed inside the nozzle 16' so that it contacts and is supported by the interior surface 17' of the nozzle. The method and apparatus of the invention are otherwise the same as described with reference to FIG. 1. The conductivity of the resulting diamond is orders of magnitude larger than diamond formed without dopants, and appears to determined by the surface area of the copper liner.

According to the invention, in order to expedite EDM machining, the resulting diamond should have a conductivity of at least $0.01\ (\Omega\text{-cm})^{-1}$ and preferably $1.0\ (\Omega\text{-cm})^{-1}$. Accordingly, in order to produce a diamond having a conductivity of approximately $0.01\ (\Omega\text{-cm})^{-1}$, a copper liner having a surface area of $5\ \text{cm}^2$ is placed inside the nozzle of the plasma jet system. Diamond is deposited onto a substrate at standard conditions of pressure, power, temperature, and gas composition (it being appreciated that these parameters as well as details of the nozzle will affect the results, but can be adjusted empirically). The resulting diamond will have a conductivity of approximately $0.01\ \Omega\text{-cm})^{-1}$.

In order to produce a diamond having a conductivity of approximately $0.1\ (\Omega\text{-cm})^{-1}$, a copper liner having a surface area of $50\ \text{cm}^2$ is placed inside the nozzle of the plasma jet system. Diamond is deposited onto a substrate at standard conditions of pressure, power, temperature, and gas composition (which can be adjusted empirically). The resulting diamond will have a conductivity of approximately $0.1\ (\Omega\text{-cm})^{-1}$.

In order to produce a diamond having a conductivity of approximately $1.0\ (\Omega\text{-cm})^{-1}$, a copper liner having a surface area of $500\ \text{cm}^2$ is placed inside the nozzle of the plasma jet system. Diamond is deposited onto a substrate at standard conditions of pressure, power, temperature, and gas composition (which can be adjusted empirically. The resulting diamond will have a conductivity of approximately $1.0\ (\Omega\text{-cm})^{-1}$.

There have been described and illustrated herein several embodiments of methods and apparatus for in-situ solid state doping of cvd diamonds and diamonds so made. While particular embodiments of the invention have been described, it is not intended that the invention be limited thereto, as it is intended that the invention be as broad in scope as the art will allow and that the specification be read likewise. Thus, while particular dopants have been disclosed, it will be appreciated that other dopants could be utilized with the method of the invention. Also, while cylindrical solid dopants have been shown, it will be recognized that other shapes of solid dopant could be used with similar results obtained. Moreover, while particular configurations have been disclosed in reference to the plasma jet system, it will be appreciated that the methods of the invention could be used with other CVD systems. It will therefore be appreciated by those skilled in the art that yet other modifications could be made to the provided invention without deviating from its spirit and scope as so claimed.

What is claimed is:

1. A method of making a doped diamond, comprising:
   a) placing a substrate beneath the nozzle of a plasma jet reactor;
   b) placing a non-powder solid dopant between the substrate and the nozzle of the plasma jet reactor, said non-powder solid dopant being chosen to provide said diamond with increased conductivity;
   c) establishing the arc jet;
   d) feeding into the arc jet the reaction chemicals necessary to deposit diamond onto the substrate; and
   e) continuing feeding the chemicals until a diamond of desired thickness is deposited onto the substrate.

2. A method according to claim 1, wherein:
   said step of placing comprises placing the non-powder solid dopant on the interior surface of the nozzle.

3. A method according to claim 2, wherein:
   said step of placing the non-powder solid dopant on the interior surface of the nozzle includes coating a portion of the interior surface with the dopant.

4. A method according to claim 2, wherein:
   said step of placing a solid non-powder dopant on the interior surface of the nozzle includes brushing a portion of the interior surface with the dopant.

5. A method according to claim 2, wherein:
   said step of placing a non-powder solid dopant on the interior surface of the nozzle includes covering a portion of the interior surface with the dopant by plating, or by a thin-film process.

6. A method according to claim 2, wherein:
   said step of placing a non-powder solid dopant on the interior surface of the nozzle includes lining a portion of the interior surface with the dopant.

7. A method according to claim 1, wherein:
   said step of placing a non-powder solid dopant includes placing a solid non-powder cylindrical dopant inside the nozzle.

8. A method according to claim 1, wherein:
   the non-powder solid dopant is chosen from a group consisting of copper, silicon and boron.

9. A method according to claim 1, wherein:
   the solid non-powder dopant has a surface area of between 5 and 500 $cm^2$.

10. A method according to claim 1, further comprising:
    f) electrical discharge milling or machining said diamond of desired thickness.

* * * * *